US011283665B2

(12) United States Patent
Gossmann et al.

(10) Patent No.: US 11,283,665 B2
(45) Date of Patent: Mar. 22, 2022

(54) METHOD AND CIRCUITS FOR DETERMINING SIGNAL PROPAGATION TIME MISMATCHES IN A MODULATOR

(71) Applicant: INTEL IP CORPORATION, Santa Clara, CA (US)

(72) Inventors: Timo Gossmann, Neubiberg (DE); Dirk Friedrich, Munich (DE)

(73) Assignee: INTEL CORPORATION, Santa Clara, CA (US)

(*) Notice: Subject to any disclaimer, the term of this patent is extended or adjusted under 35 U.S.C. 154(b) by 193 days.

(21) Appl. No.: 16/487,107

(22) PCT Filed: Feb. 8, 2018

(86) PCT No.: PCT/US2018/017337
§ 371 (c)(1),
(2) Date: Aug. 20, 2019

(87) PCT Pub. No.: WO2018/182857
PCT Pub. Date: Oct. 4, 2018

(65) Prior Publication Data
US 2021/0144045 A1 May 13, 2021

(30) Foreign Application Priority Data
Jan. 4, 2017 (EP) .................................... 17164447

(51) Int. Cl.
*H04L 27/36* (2006.01)
(52) U.S. Cl.
CPC .......... *H04L 27/364* (2013.01); *H04L 27/366* (2013.01)
(58) Field of Classification Search
CPC ... H04L 27/364; H04L 27/366; H04L 27/361; H03C 5/00
See application file for complete search history.

(56) References Cited

U.S. PATENT DOCUMENTS 7,254,195 B2 * 8/2007 Servilio ................ H04L 27/361
375/345
2007/0183532 A1 8/2007 Matero
(Continued)

FOREIGN PATENT DOCUMENTS

EP 3035625 A1 6/2016
GB 2368214 A * 4/2002 ........... H03F 1/3282

OTHER PUBLICATIONS

"Chapter 2: Radar Fundamentals" In: Kissinger, Dietmar: "Millimeter-Wave Receiver Concepts for 77 GHz Automotive Radar in Silicon-Germanium Technology".
(Continued)

*Primary Examiner* — Sophia Vlahos
(74) *Attorney, Agent, or Firm* — 2SPL Patent Attorneys PartG mbB; Yong Beom Hwang

(57) ABSTRACT

A method for determining a signal propagation time mismatch in a modulator comprises generating a predetermined signal shape of a amplitude component of a radio frequency signal generating one or more predetermined conditions in a frequency component of the radio frequency signal at a first time interval relative to the predetermined signal shape and detecting the one or more predetermined conditions in the frequency component at a second time interval. The method further includes determining the amplitude component at the second time interval and calculating a signal propagation time mismatch value based on the signal shape of the amplitude component, on the first time interval and the second time interval.

11 Claims, 7 Drawing Sheets

(56) References Cited

U.S. PATENT DOCUMENTS

| | | |
|---|---|---|
| 2007/0237258 A1 | 10/2007 | Shakeshaft |
| 2008/0205571 A1 | 8/2008 | Muhammad et al. |
| 2009/0130998 A1 | 5/2009 | Zolfaghari et al. |
| 2010/0124889 A1 | 5/2010 | Osman et al. |
| 2011/0142177 A1* | 6/2011 | Kang ............ H04L 27/361 375/340 |
| 2013/0156083 A1 | 6/2013 | Jechoux et al. |
| 2016/0182162 A1* | 6/2016 | Belitzer ............ H04H 20/12 375/261 |
| 2018/0287569 A1* | 10/2018 | Xu ............ H03F 3/211 |

OTHER PUBLICATIONS

Stefan Savage: "Lecture 3: Signaling and Clock Recovery".

* cited by examiner

US 11,283,665 B2

METHOD AND CIRCUITS FOR DETERMINING SIGNAL PROPAGATION TIME MISMATCHES IN A MODULATOR

FIELD

An example relates to an exemplary method and an exemplary circuit for determining a signal propagation time mismatch in a transmitter or a modulator.

BACKGROUND

Transmitters of radio frequency (RF) signals use modulators to generate the modulated radio frequency signal from a baseband signal. Modulators exist with different technologies. In I/Q modulators (also called quadrature or vector modulators), the output signal is composed by summation of the output of two topologically equivalent signal processing paths. Two equivalent baseband signal processing lineups are providing the inphase (I) and quadrature (Q) component of the modulation signal, which are multiplied in two equivalent mixer circuits with two local oscillator signals (LO), which are 90 degree phase shifted with respect to each other. Summing the two paths' outputs generates the desired modulated RF signal. Due to the equivalence of both signal processing paths, a I/Q modulator is inherently balanced and nearly equal signal processing delay of both paths is given by design.

In a polar modulator, the modulated RF signal is generated by amplitude-modulation of a phase-modulated RF carrier signal, the phase modulation also being generated within the polar modulator. In the equivalent baseband representation of the modulated RF signal, this corresponds to a modulated signal description with time-dependent magnitude or amplitude r(t) and angle φ(t) (phase), other than the common description for polar modulators using I(t) and Q(t). Polar modulators, therefore, comprise a phase signal processing path and an amplitude signal processing path of different architecture and, therefore, eventually having different data processing delays resulting in a signal propagation time mismatches at a merge point in the lineup, where the two paths are combined. To reach reasonable transmit performance, a delay should to be aligned very accurately, i.e. a precise alignment of amplitude and phase information. For example, artificial signal delay stages can be inserted into one or both path because an inherent delay equivalence is not given. Artificial delay stages may comprise multi-stage pipeline structures with system clock period granularity or (digital) filter structures (e.g. allpass) where the group delay may be used to achieve sub-system clock period delays. In order to be able to adjust the delay stages, there is a desire to determine signal propagation time mismatches accurately and without the necessity to employ additional expensive circuitry.

BRIEF DESCRIPTION OF THE FIGURES

Some exemplary examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1A:
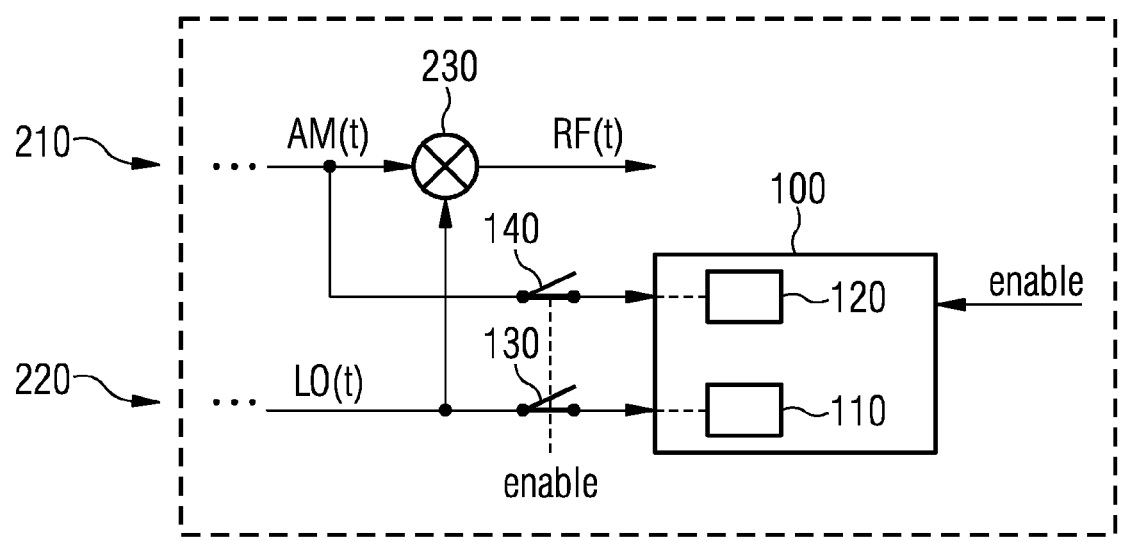
FIG. 1a illustrates an example of an exemplary circuit for determining amplitude and phase signal propagation time mismatch in a polar transmitter.

FIG. 1a illustrates an example of a circuit 100 for determining an amplitude and phase signal propagation time mismatch in a polar transmitter 200. An example of a polar transmitter 200 is shown in FIG. 1b for illustrative purposes and is shortly described subsequently, before an exemplary circuit for determining amplitude and phase signal propagation time mismatch in a polar transmitter will be described referring to FIG. 1a.

Figure 1B:
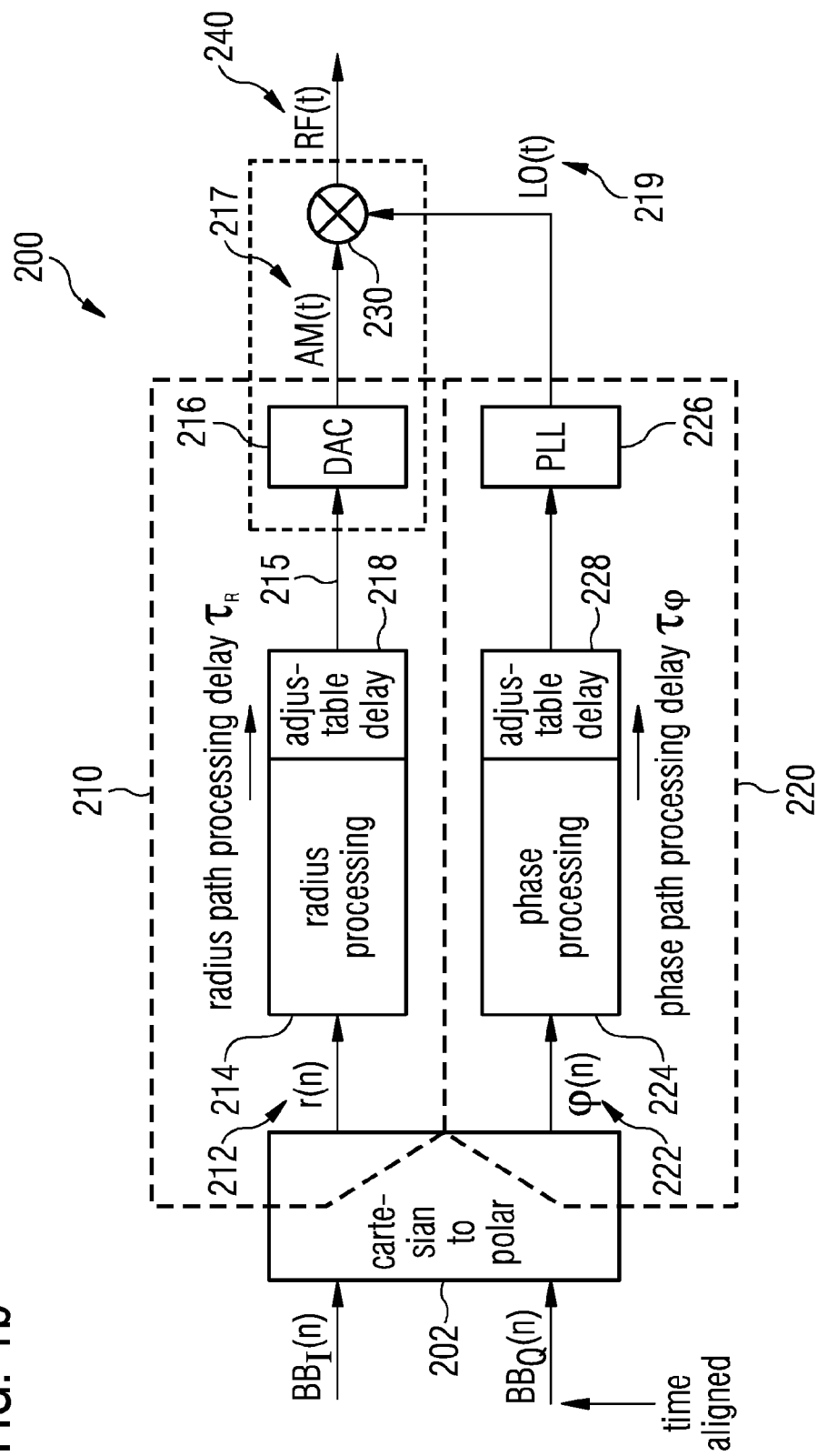
FIG. 1b illustrates an example of a polar modulator.

The polar transmitter 200 of FIG. 1b comprises an amplitude signal processing path 210 and a phase signal processing path 220. In the phase signal processing path 220, an angle component 222 of a polar representation of the baseband signal or—if a Cartesian to Polar converter circuit 202 also performs upsampling—the associated radio frequency signal is input into a phase processing circuit 224. The phase processing circuit 224 derives a phase value for a radio frequency carrier signal that corresponds to the angle component 222. In order to directly generate the phase modulated carrier signal LO(t), the so determine phase value is used to control a phase lock loop circuit 226 to modulate a carrier signal LO to generate the phase modulated carrier signal LO(t).

Amplitude signal processing path receives an amplitude component 210 of the polar representation of the baseband or the radio frequency signal at an amplitude processing circuit 214 which may, for example, derive an amplitude modulation value 215 for a resultant modulated RF signal 240 that corresponds to the input amplitude component 210. Amplitude and radius are subsequently used synonymous for the signal component that predominantly defines the energy of the signal. A digital to analog converter 216 converts the digital amplitude modulation value 215 to a corresponding analog amplitude modulation waveform 217 which is afterwards being multiplied with the phase modulated carrier signal 219 (LO(t)) to generate the modulated RF signal 240. Both the phase signal processing path 220 and the amplitude signal processing path 210 comprise adjustable delay elements 218 and 228, respectively, in order to appropriately reduce signal propagation time mismatches between the phase signal processing path 220 and the amplitude signal processing path 210. If the signals of both paths arrive at the multiplier timely aligned, a resultant modulated RF signal 240 has a clean spectrum, which is desirable. In the example of FIG. 1b, the angle component 222 and the amplitude component 212 are derived from an I/Q representation of the baseband signal by means of the Cartesian to Polar converter circuit 202. Even though the modulator may work in the polar domain, the modulation information may initially be available in I(t)/Q(t) format in the baseband domain, so that in the signal processing chain the I/Q->polar conversion is executed by Cartesian to Polar converter circuit 202. This may, for example, be done with a CORDIC or similar device, which processes the mathematical operation of $$r(t)=\mathrm{SQRT}(I(t)^{\wedge}2+Q(t)^{\wedge}2)$$

$$\varphi(t)=\arctan(Q(t)/I(t)).$$

The baseband signal may also be initially generated in the Polar representation in further examples.

While FIG. 1b illustrates an exemplary principal layout of a polar modulator, further examples may be implemented differently. For example, a radio frequency digital to analog converter may be used to synthesize the modulated RF signal 240 instead of using analog signals and a multiplier 230.

FIG. 1a illustrates that a circuit 100 to determine an amplitude and phase signal propagation time mismatch may be coupled to the phase signal processing path 220 and to the amplitude signal processing path 210 directly before the multiplier 230. This may assure that the mismatch is determined closely to the signal processing component merging the signals from the two paths so as to not risk the generation of further mismatch between the circuit 100 and the merging point being given by the multiplier 230 in the example of FIG. 1.

Circuit 100 comprises an analyzing circuit 110 coupled to the phase signal processing path 220 of the transmitter and an evaluation circuit 120 coupled to the amplitude signal processing path 210 of the transmitter. The coupling is performed by means of switches 130 and 140 so that both the analyzing circuit 110 and the evaluation circuit 120 can be independently connected and disconnected to the processing paths. In some examples, the analyzing circuit 110 and the evaluation circuit 120 are concurrently coupled to the phase signal processing path 220 and to the amplitude signal processing path 210 to determine an amplitude and phase signal propagation time mismatch between the two signal processing paths. The analyzing circuit 110 is configured to detect one or more predetermined conditions in the frequency component of the radio frequency signal during a second time interval including giving second time instant, the one or more predetermined conditions (also referred to as significant condition) having been generated within the frequency component during a first time interval including providing a first time instant. For example, the analyzing circuit detects a certain feature or a certain signal characteristic as the significant condition in the frequency component. The second time instant or the second time interval is so given by the time when the one or more predetermined conditions are detected. The particular characteristic defining the significant condition or the predetermined conditions can be arbitrary, however, it may be beneficial if the characteristic defining the significant condition can be detected unambiguously and with reasonable effort. According to some examples, a change of an instantaneous frequency of the frequency component is detected as the significant condition, which may allow the detection with high temporal resolution and reasonable hardware complexity.

At the second time instant, the evaluation circuit 120 determines the amplitude value presently processed within the amplitude signal processing path 210. The determination may, for example, be triggered by the analyzing circuit 110. The evaluation circuit 120 further comprises a priori knowledge on a predetermined signal shape of the amplitude component and on an expected amplitude value. A predetermined signal shape may, for example, be any monotonous signal shape, like the linearly increasing signal illustrated by graph 410 of FIG. 4. Other appropriate signal shapes, may, for example, be linearly decreasing signals of different slope or parabolic functions. The expected amplitude value is the amplitude value that would be expected if no signal propagation time mismatch would exist between the phase signal processing path 220 and the amplitude signal processing path 210. The expected amplitude value, therefore, is the amplitude value of the predetermined signal shape at the first time instant the significant condition was generated in the frequency component, provided that the generation of the frequency component and the simultaneous observation of said amplitude value is performed at a location within both signal paths, where the signal paths are still synchronized.

Having the a priori knowledge on a predetermined signal shape of the amplitude component and on the expected amplitude value, the evaluation circuit is capable of calculating the signal propagation time mismatch between both signal paths between a first point where the predetermined signal shape and the significant condition are inserted into both signal paths and a second point where the evaluation signal and the analyzing circuit are coupled to the signal path. A priori knowledge is the knowledge on the predetermined signal shape that has been inserted into the amplitude signal processing path 210 at the first point without the necessity to measure a signal, to otherwise deductively determine the signal or the like. Further to the a priori knowledge, the signal shape is additionally measured or determined by observing the signal within the amplitude signal processing path 210 at the second point of the circuit 100.

The determined signal propagation time mismatch may then be used to adjust either one or both of the adjustable delay elements 218 and 228 to achieve synchronization at the second point.

Figure 2:
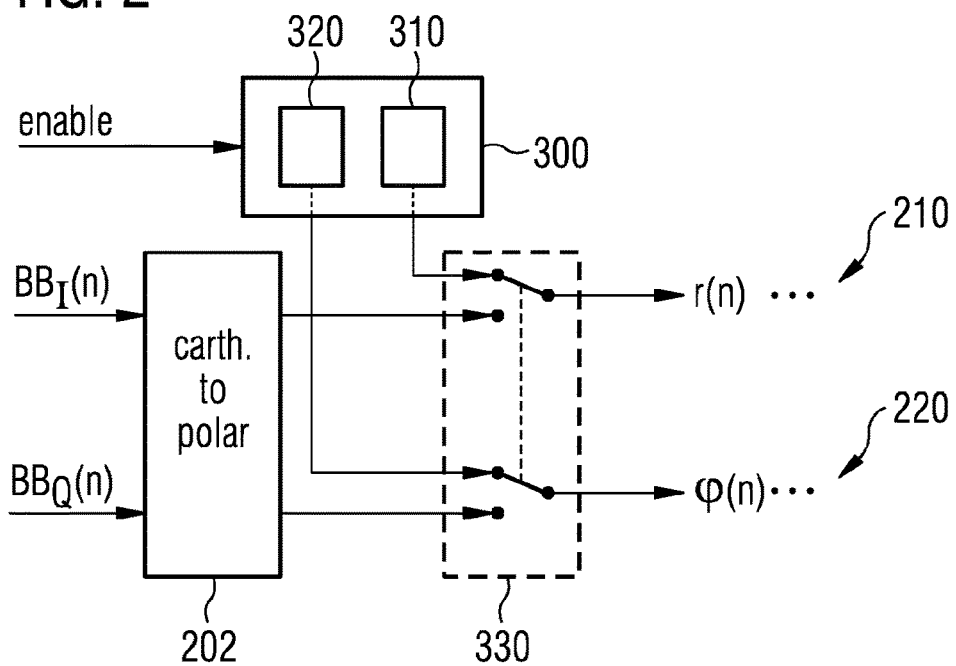
FIG. 2 illustrates an example of an exemplary test signal generation circuit for a polar transmitter.

FIG. 2 illustrates an example of an exemplary test signal generation circuit 300 for a polar transmitter, which is coupled to both signal paths directly after the Cartesian to Polar converter circuit 202. The test signal generation circuit 300 comprises an amplitude signal generator 310 and a frequency signal generator 320. The amplitude signal generator 310 is configured to generate the predetermined signal shape of the amplitude component and the frequency signal generator 320 is configured to generate the significant condition in the frequency component of the radio frequency signal at a predetermined first time instant relative to the predetermined signal shape. A multiplexer 330 serves to couple the test signal generation circuit 300 with the signal paths for calibration and to disconnect the test signal generation circuit 300 from the signal paths during normal operation. Coupling the test signal generation circuit 300 to the signal paths directly downstream the Cartesian to Polar converter circuit 202 may be beneficial since the signal propagation characteristics of the Cartesian to Polar converter circuit 202 are often well defined. As a result, the essential components causing signal propagations differences between the signal paths are covered by choosing the first point to couple the test signal generation circuit 300 and the second point to couple the circuit 100 to determine an amplitude and phase signal propagation time mismatch to the signal paths as illustrated in FIGS. 1 and 2.

In other words, in the I/Q domain the signal streams are normally timing matched and at the first position after the transition to the polar domain a particular test signal is injected into the polar signal processing chain as an alternative to the output of the CORDIC 202. This may assume, that the CORDIC has a known delay from I/Q input to the respective outputs, which is ideally equal or can be at least encountered for as a correction factor in the later applied signal propagation time mismatch (amplitude modulation/phase modulation path delay) calculation. This may be easily achieved since the CORDIC operation frequency is normally fixed and therefore the path latencies can be easily calculated.

Figure 3:
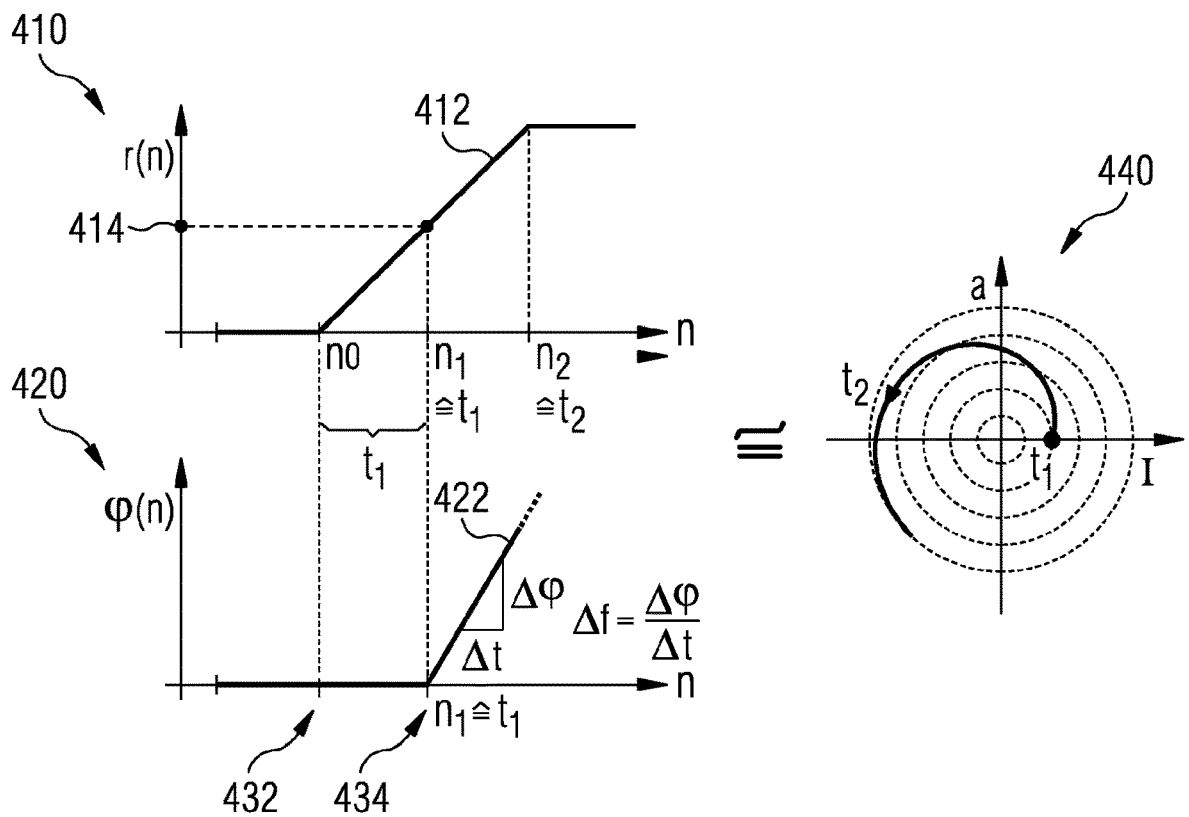
FIG. 3 illustrates an example of an exemplary test signal.

FIG. 3 illustrates an example of a test signal. A test signal may comprise two components. A first component is a test signal for the amplitude signal processing path 210, subsequently referred to as the amplitude component. A second component for the phase signal processing path 220 is referred to as the frequency component. Much like at normal operation of the Modulator, both components together define a signal trajectory in the I/Q plane, as illustrated in FIG. 3, right illustration 440. Illustration 410 to the left shows an exemplary example for a predetermined signal shape of the amplitude component 412, which may be implemented as a ramp, according to various exemplary implementations of the invention. That is, the amplitude signal generator 310 is configured to generate a linearly increasing amplitude component. Further, illustration 420 shows a corresponding example for the frequency component 422 of the test signal, also given as a ramp signal. While the frequency component is defined by means of a phase φ(n) of a local oscillator signal in the example of FIG. 3, further examples may likewise define the instantaneous frequency of the frequency component in order to describe and generate the signal. The ramp of the amplitude component starts at time instant 432, while the ramp for the phase component starts at a later time instant 434, where the amplitude component already has reached an expected amplitude value 414. In the example of FIG. 3, the amplitude component and the frequency component are illustrated as depending on sample number n, further examples may likewise define them as depending on time or on another parameter.

The test signal of FIG. 3 can fulfill arbitrary requirements since it can be composed precisely as required if e.g. a digital I/Q data memory containing the data is read out and applied to the CORDIC input. Described in the polar plane the test signal starts with both amplitude component 412 and phase component 422 set to zero (this corresponds to an unmodulated PLL 226 operating on the selected channel center frequency with nulled carrier amplitude at the modulator output. At a certain point in time (n0=t0, 432) the amplitude starts to increase linearly with a certain rate. This means that the unmodulated carrier amplitude ramps up at the transmitter output, as illustrated by the illustration 440. At a certain further point in time (n1=t1, 434) when the radius has reached a certain level 414 (r1), the phase starts to ramp up linearly at a certain rate while the radius still increases. The expected amplitude value 414 is, therefore, given by the amplitude or radius value inserted at time instant 434 (t1). At the modulator output this corresponds to a still increasing RF signal amplitude, but at an offset with respect to the initially unmodulated frequency. The linear ramp of the phase generates a change of the instantaneous frequency of the frequency component since the frequency is proportional to the time derivative of the phase. In this implementation, the test signal generation circuit generates a significant change of the instantaneous frequency of the frequency component, which may be detected further downstream the signal path.

At the AM/PM path merging point in the polar lineup, i.e. at the second point in which the circuit 100 for determining an amplitude and phase signal propagation time mismatch is coupled to both signal paths, both signals' trajectory has to be determined again. In particular, their state change is detected and brought into relation. From knowing the time relation between the amplitude component (AM) and the phase component (PM) of the test signal at the injection point and by detecting their relation at the merging point, the unknown AM/PM signal propagation time mismatch (propagation delay difference) can be deduced. The circuit 100 may be hooked up as close as possible to the signal paths merge point (multiplier 230 of FIG. 1) to encounter all included delay differences in AM and PM path and to minimize the residual non-determinism due to circuit imperfections. As illustrated above, injecting the test signal downstream the CORDIC 202 may result with the test signals being simple. Basically, ramp functions may be sufficient. However, if the intrinsic signal delay of the CORDIC 202 would be hard to predict, an equivalent set of test signals can also be applied to the CORDIC input in alternative examples. For example, such a test signal may be composed of sine- and cosine-functions of increasing amplitude and frequency to be input to CORDIC 202.

Figure 4:
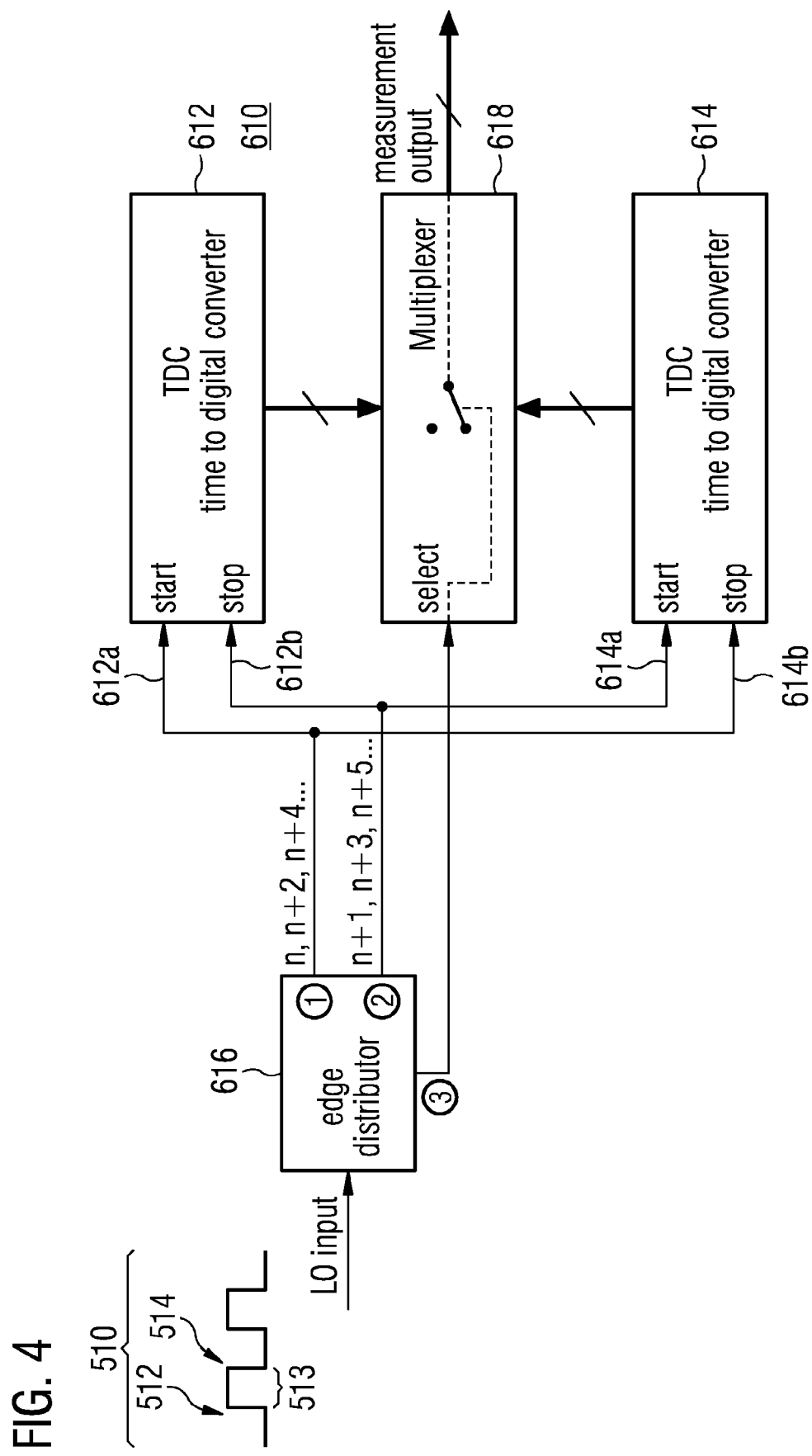
FIG. 4 illustrates an example of an exemplary analyzing circuit to detect a significant condition in a frequency component of the radio frequency signal.
Figure 5:
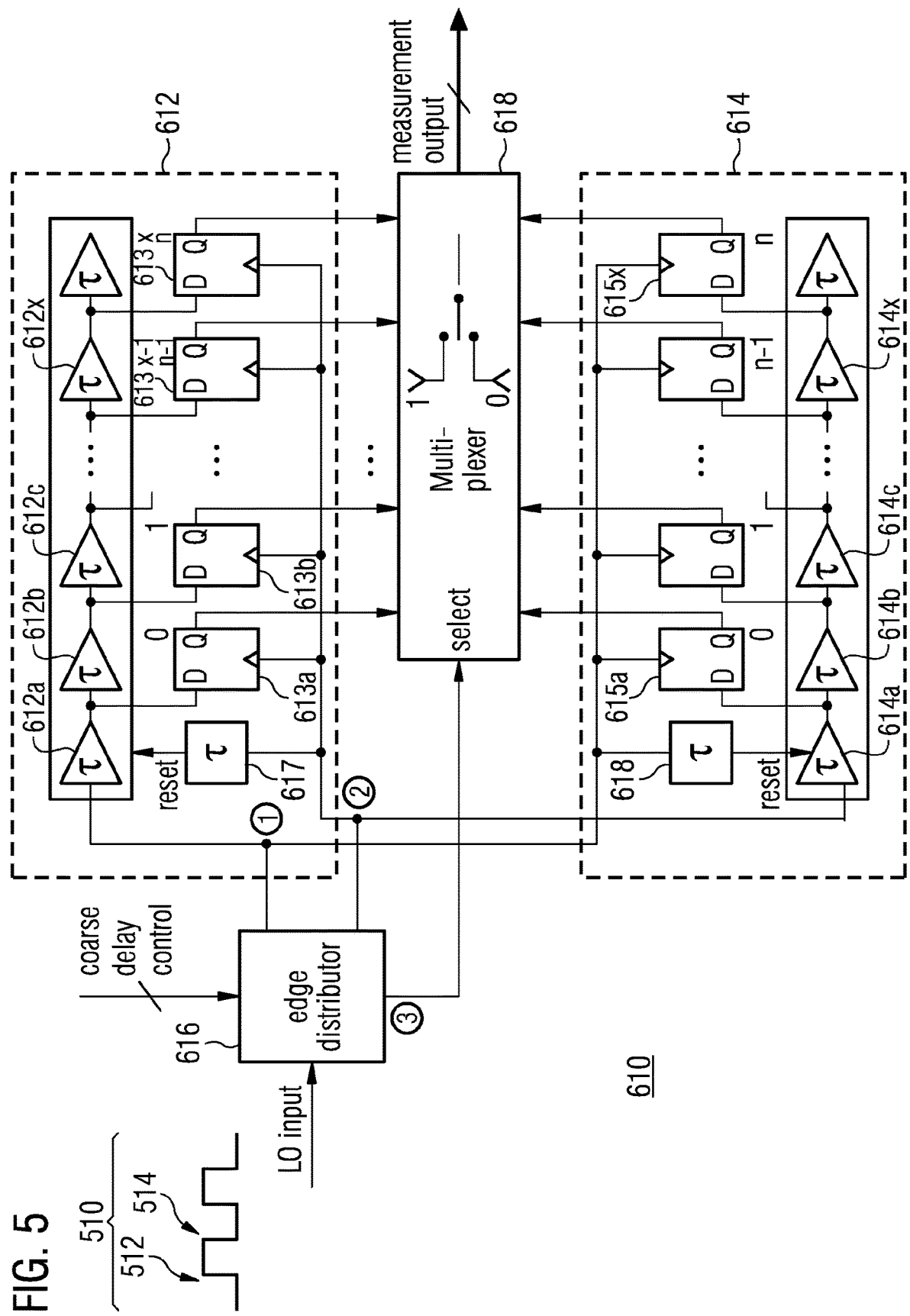
FIG. 5 illustrates an example for an exemplary period determination circuit to determine a present time interval between a pair of two consecutive edges of the frequency component.
Figure 6:
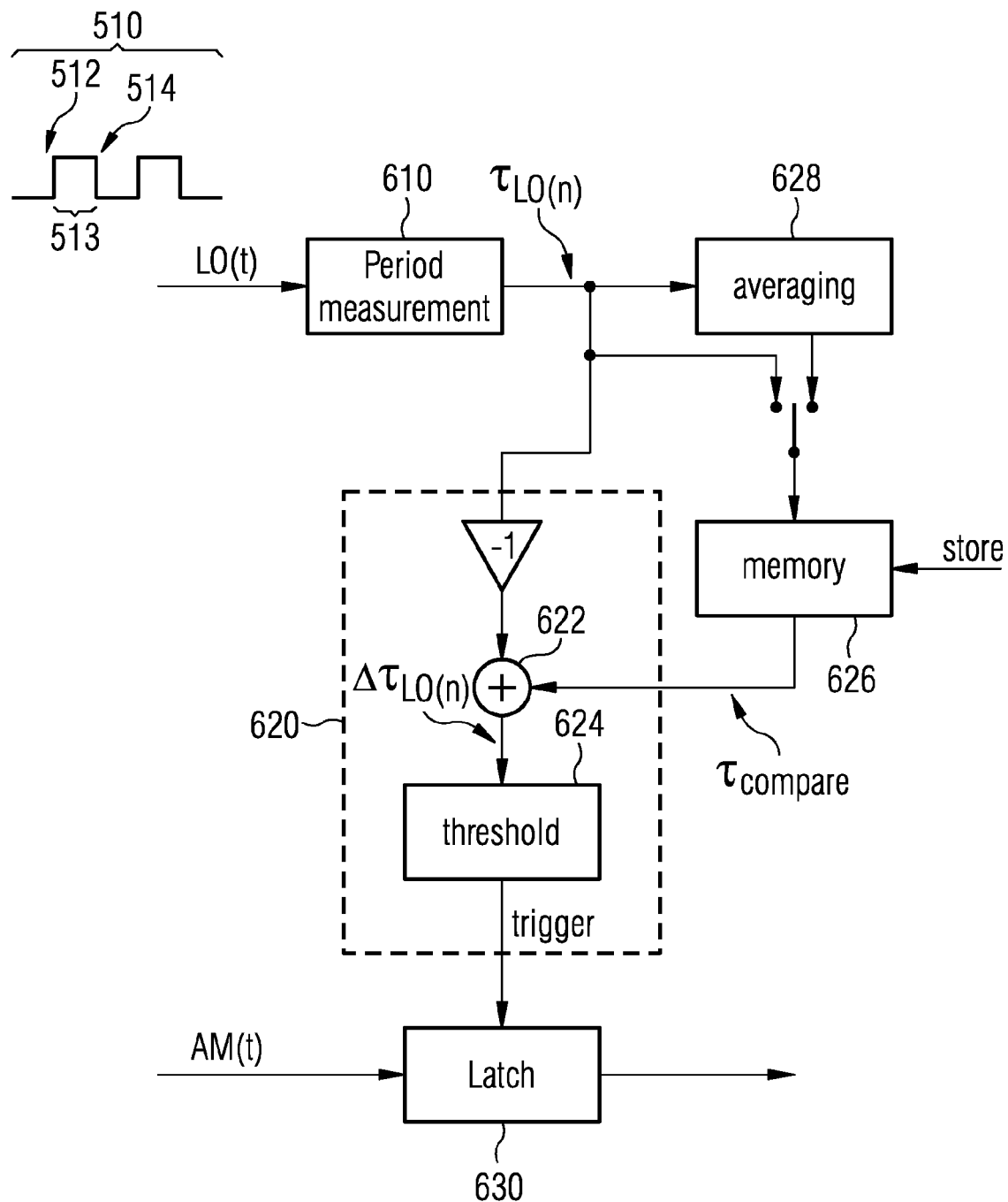
FIG. 6 illustrates an example for an exemplary circuit to determine a change of an instantaneous frequency of the frequency component.

As illustrated in FIGS. 4 to 6, the analyzing circuit 110 or measurement unit may comprise a period determination circuit 610 (detector) which measures the period of the applied LO(t) signal, which corresponds the frequency component of the radio frequency signal. The period determination circuit 610 determines a present time interval 513 between a pair of two consecutive edges 512 and 514 of the frequency component. The analyzing circuit 110 generates a trigger signal whenever the momentary period change compared to the previous period duration or compared to the average duration of the previous period exceeds a certain threshold. To this end, the circuit 100 may comprise a comparator 620 configured to determine, if the present time interval deviates by more than a predetermined threshold from a previous time interval between at least one previous pair of two consecutive edges of the frequency component. In the implementation of FIG. 6, the comparator 620 is implemented using an adder 622 and a threshold circuit 624. The actual measured period duration is subtracted from a stored value of the time interval between at least one previous pair of two consecutive edges of the frequency component. If the difference is exceeding a certain threshold, a trigger signal is generated, which in turn samples the actual value of the amplitude component (AM(t) signal) in a latch 630. The time interval between at least one previous pair of two consecutive edges of the frequency component is stored in a memory 626. If the previous time interval is an average value of multiple preceding cycles, the circuit may optionally comprise an averaging circuit 628 to compute said average value.

While subsequently, FIGS. 4 and 5 will illustrate particular implementations for a period determination circuit 610, the following paragraphs shortly summarize as to how the signal propagation time mismatch may be calculated when using a test signal as illustrated in FIG. 3. For the following considerations, it is assumed that the frequency component LO(t) and the amplitude component AM(t) are synchronous, i.e. a sample of the amplitude component AM(t) is assumed to be updated with every edge of the frequency component LO(t). This may achieve that the whole arrangement can be designed as a synchronous circuit.

From the latched AM(t) value and the expected AM(t) value 414 (==r1) the accumulated delay difference in AM and PM signal processing paths can be deducted by simple linear extrapolation when the change rate of the generated and injected AM(t) is known. If an additional amount of pipelining stages between detecting the LO-period duration change and latching the AM-signal cannot be avoided, the delay back-calculation may further consider two different LO-frequencies.

For the following it is supposed that at the test signal injection point of the test signal generation circuit 300, the LO(t) frequency starts to increase at t=t1 where AMinjected (t1)=r1. At the measurement side at circuit 100 the frequency change is detected at t=t2 and the latched amplitude component AMmeasured(t2)=r1+delta_r. If the injected AM(t) raises at a rate of dAM(t)/dt=m, the signal propagation time mismatch value (AM-PM delay) can be determined to be dt=delta_r/m. In other words, the signal propagation time mismatch value is determined as the time difference between the predetermined signal shape of the amplitude component having a first value at the time of the generation of the significant condition by the test signal generation circuit 200 and a second value at the time of the detection by circuit 100. For a precise measurement of the signal propagation time mismatch value dt, a large AM change rate is desirable. If this exceeds the possibilities of the system to be calibrated, an iterated/multi-step approach can be chosen according to the following considerations: Initially m is chosen moderate, based on the obtained value of dt, the AM or PM path delay is adjusted to match them coarsely. In successive steps, m may then be gradually increased (while the frequency step time t1 is always chosen such that this starts at AM(t=t1)=r1), so that the signal propagation time mismatch value dt can be determined with increasing accuracy.

For higher accuracy, the complete procedure can be repeated multiple times to determine an average value for the signal propagation time mismatch value dt. In a practical application, LO(t) can span a larger range, due to different channel frequencies within a cellular frequency band. In order to correct for signal propagation time mismatch at all channel frequencies, the procedure may be executed for at least two different settings of initial LO-frequencies (for a first center frequency and for a second center frequency) to determine first and a second signal propagation time mismatch values (before introducing the frequency step at the respective t=t1 times). This is because the obtained value for dt is depending on the (unmodulated) LO center frequency. From the multiple determined values for 'dt(fLO)' the necessary settings for AM/PM path delay can be linearly calculated and applied later during applicative operation of the modulator at different channel frequencies e.g. at a third center frequency). In other words, a method for calibrating a signal propagation time mismatch between a amplitude signal path and a phase signal path of a modulator may comprise determining a first signal propagation time mismatch value for a first center frequency of the transmitter and determining a second signal propagation time mismatch value for a second center frequency of the transmitter. For a third center frequency of the transmitter, a third signal propagation time mismatch value is computed based on the first signal propagation time mismatch value, the signal propagation time mismatch value, the first center frequency and the second center frequency.

FIG. 4 illustrates an example for a period determination circuit 610 using a first time to digital converter 612 (TDC) and a second TDC 614. Start and Stop inputs 612a, 612b and 614a, 614b of the TDC's 612 and 624 are coupled to a signal edge distributer 616 such that the first time to digital converter 612 uses every rising signal edge of the input frequency component 510 as a start and every falling signal edge as a stop. The second time to digital converter 614 using every falling signal edge as a start and every rising signal edge as a stop. Essentially, the two TDC's 612 and 614 are operated in alternating manner to be able to perform a measurement on every LO cycle, the first TDC 612 measuring the time interval between a pair of two consecutive rising and falling edges of the frequency component, while the second TDC 614 measures the time interval between a pair of two consecutive falling and rising edges of the frequency component. Multiplexer 618 is used to alternatingly switch the output of both TDCs 612 and 614 to further components of a circuit to determine a change of an instantaneous frequency of the frequency component as illustrated in FIG. 6.

FIG. 5 illustrates a further example for a period determination circuit and a particular implementation of the principle illustrates in FIG. 4.

The TDC's 612 and 614 of FIG. 4 are implemented using two delay lines which are operated in alternating manner to be able to perform a measurement on every LO cycle. The delay lines are composed of a series of unit delay cells 612a, . . . , 612x and 614a, . . . , 614x, respectively. A related number of sample flip-flops (FF) 613a, . . . , 613x and

615a, . . . , 615x are used to store snapshots of the states of the delay lines. Depending on the internal makeup of a unit delay cell, it might be required to reset the delay line after its state is captured. This may optionally be achieved by optional reset circuits 617 and 619, which propagate the reset signal of the associated delay lines as a slightly delayed version of the capture signal (FF clock). The incoming LO signal is distributed to either the upper or the lower delay line by means of an edge distributor circuit, so that whenever the lower line of the second TDC 614 receives a start pulse, the upper line state is sampled by means of the distribution of a signal edge to the clock input of each flip-flop 613a, . . . , 613x of the upper line and vice versa.

Both delay lines' outputs are multiplexed to the very output of the period measurement unit with the help of multiplexer 618, which is also controlled from a signal provided from the edge distributor circuit. The output values of the period determination unit 610 can be fed into the averaging circuit 628 or directly into the memory 626 as shown in FIG. 6, depending on whether averaging is to be used or not.

The measurement resolution of the period determination circuit 610 is increased with shorter unit delay factors of the unit delay elements and the capture range can be enlarged by a larger number of unit delay cells and capture FFs.

Some examples optionally comprise a coarse delay circuit within the analyzing circuit 100 to apply a coarse delay to the frequency component prior to the period determination circuit 610. The adjustable coarse delay may be inserted to the LO signal path so that the LO pulses receive a certain base delay before they enter the actual measurement delay line. The coarse delay may—with still an unmodulated LO frequency being used—be increased until the delay line snapshots use the length of the delay line extensively. This may, for example, be the case when about 90% of the available line length is used if the frequency jump is positive, while about 10% of the available line length is used if the frequency jump is negative.

Figure 7:
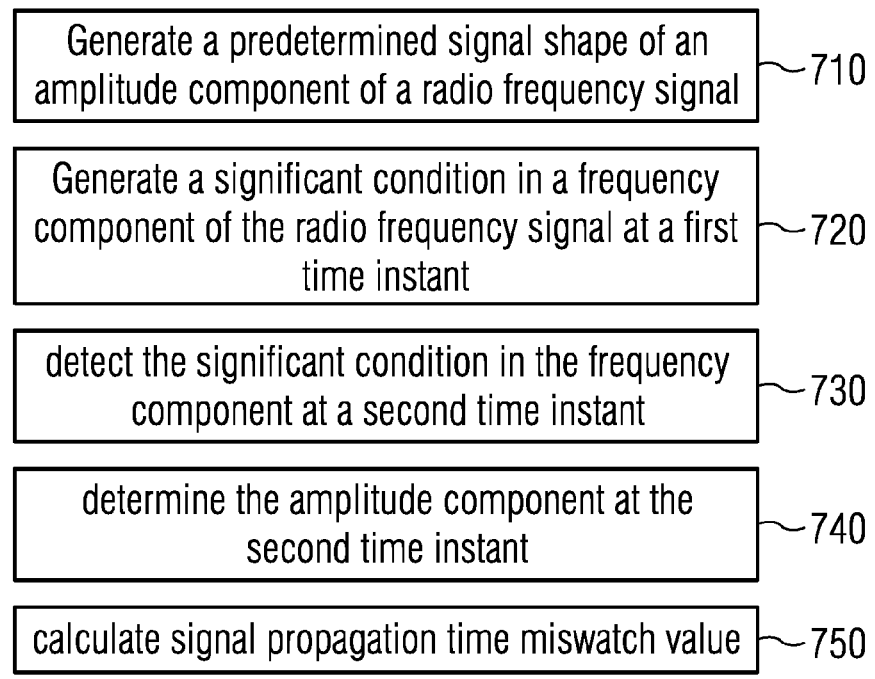
FIG. 7 illustrates a flowchart of an example of an exemplary method for determining a signal propagation time mismatch in a modulator.

FIG. 7 schematically illustrates a flowchart of an example of a method for determining a signal propagation time mismatch in a modulator.

The method comprises generating 710 a predetermined signal shape of an amplitude component of a radio frequency signal as well as generating a significant condition 720 in a frequency component of the radio frequency signal at a first time instant relative to the predetermined signal shape.

Further, the method comprises detecting the significant condition 730 in the frequency component at a second time instant and determining the amplitude component 740 at the second time instant.

As elaborated on in the previous paragraphs, the method also comprises calculating a signal propagation time mismatch value 750 based on the signal shape of the amplitude component, the first time instant and the second time instant.

In various exemplary implementations, the method further comprises generating a second predetermined signal shape of a amplitude component of a radio frequency signal and generating the significant condition in the frequency component of the radio frequency signal at the first time instant as well as detecting the significant condition in the frequency component at a third time instant. Further, the method comprises determining the amplitude component at the third time instant and calculating a second time mismatch value based on the second predetermined signal shape of the amplitude component, the first time instant and the third time instant. The method further comprises combining the time mismatch value and the second time mismatch value to determine the signal propagation time mismatch of the amplitude and frequency signal in a transmitter. Using different signal shapes for the generation of the amplitude component may serve to determine the signal propagation time mismatch with a time resolution beyond the intrinsic time resolution of the TDCs. For example, if the slope of the amplitude component of the test signal of FIG. 3 is increased and if for a first number of measurements one particular bin of the TDC is triggered and that for a second number of measurements a second bin is triggered, the first number, the second number, the first slope and the second slope can be used to interpolate between the measurements and to increase the time resolution of the measurement beyond the time associated to an individual bin.

Similarly, the time resolution may be increased by varying the point in time where the significant condition is generated. Optionally, therefore, the method may further comprise generating a significant condition in a frequency component of the radio frequency signal at a fourth time instant relative to the predetermined signal shape; detecting the significant condition in the frequency component at a fifth time instant; determining the amplitude component at the fifth time instant; calculating a third time mismatch value based on the predetermined signal shape of the amplitude component, the fourth time instant and the fifth time instant; and combining the time mismatch value and the third time mismatch value to determine the signal propagation time mismatch of the amplitude and frequency signal in a transmitter.

Figure 8:
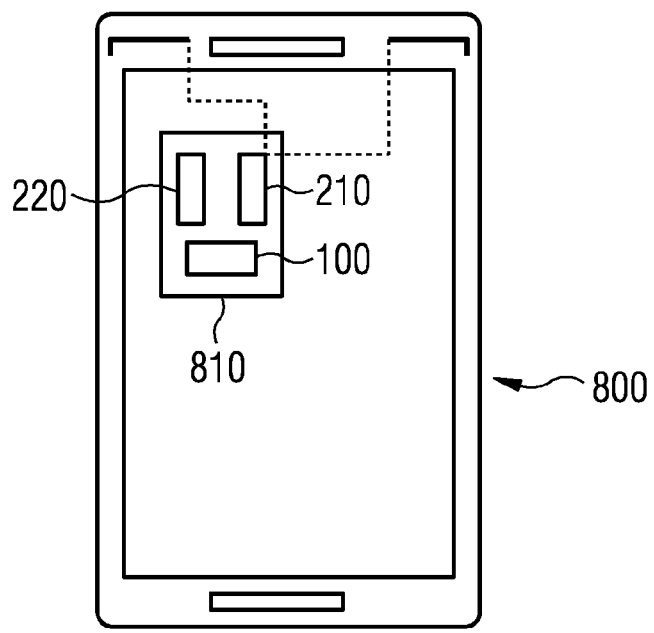
FIG. 8 illustrates an example of an exemplary mobile telecommunications device.

FIG. 8 schematically illustrates an exemplary mobile handset 800 as an example of a mobile telecommunications device using a polar transmitter 810 having an amplitude signal processing path 210 for generating an amplitude signal component, a phase signal processing path 220 for generating a frequency signal component and circuit 100 for determining an amplitude and phase signal propagation time mismatch coupled to both the amplitude signal processing path 210 and the phase signal processing path 220.

Examples describe an alternative method and a cheap to implement hardware add-on to a (digital) polar modulator which can be used to determine the signal propagation time mismatch (AM/PM path delay) without the need to use an external lab measurement setup. A test signal is injected at the path split point and their relative propagation delay is detected at the signal merge point, where AM and PM signal are meeting again to form the composite RF signal.

This avoids to derive the necessary settings for the artificial delay compensation stages in AM/PM paths from pure simulations or other theoretical considerations, which is often to inaccurate. Further, a typical, time resource consuming approach to determine the necessary settings on a real assembled system based on a series of measurements on a readily manufactured hardware sample in the lab and applying the results with some additional considerations on the complete lot of all devices of the same kind is avoided. Such extensive measurements would normally require to provide a regular modulated test signal representing a typical input signal to the modulator and to observe the RF parameter with high bandwidth. If AM and PM paths signal processing are mismatched, increased mismatch may be detected with increasing unsymmetrical characteristics of left and right sided adjacent channel modulation leakage (e.g. ACLR parameter in UMTS/LTE). The costly conventional approach of sweeping the added artificial delay and determining the one which results in best symmetry of ACLR or of another comparable parameter can be avoided. Since the whole conventional procedure has to be repeated for different operating conditions, frequencies, process corners, etc. and finally the derived settings have to be stored in the device (fusing/boot-load/software) to be applied to the correction delay stages during modulator operation, the use of one of the preceding examples serves to significantly reduce complexity and cost for a high performance modulator. In particular, prior effort in device characterization in the lab can be saved, which is expensive, requires extra measurement equipment and prevents reaction on changed conditions as soon as the device is deployed in the system and shipped to the customer.

This comes with almost no additional effort and with inexpensive built-in means to determine the necessary delay settings in a self-contained manner without the need to integrate a high performance receiver, capable to measure the indicative RF parameter with high precision, which would be very complex and expensive.

Example 1 is a method for determining a signal propagation time mismatch, comprising generating a predetermined signal shape of an amplitude component of a radio frequency signal; generating one or more predetermined conditions in a frequency component of the radio frequency signal during a first time interval relative to the predetermined signal shape; detecting the one or more predetermined conditions in the frequency component during a second time interval; determining the amplitude component at the second time instant; and determining a signal propagation time mismatch value based on the signal shape of the amplitude component, on the first time interval and on the second time interval.

In example 2, in the method of example 1, the amplitude component is generated to linearly increase.

In example 3, in the method of example 1 or 2, the frequency component is generated to comprise a change of its instantaneous frequency at the first time interval.

In example 4, in the method of example 3, the frequency change is generated by a linear increase of the initial phase value, starting from the first time interval.

In example 5, in the method according to any of the preceding examples, the signal propagation time mismatch value is calculated using a first value of the amplitude component at the first time interval and a second value of the amplitude component which is determined at the second time interval.

In example 6, in the method according to example 5, the signal propagation time mismatch value is determined as the time difference between the predetermined signal shape of the amplitude component having the first value and the second value.

In example 7, the method according to any of examples 3 to 6 optionally further comprises detecting the one or more predetermined conditions if a time interval between a pair of two consecutive edges of the frequency component deviates by more than a predetermined threshold from a previous pair of two consecutive edges of the frequency component.

In example 8, the method of any of the preceding examples, optionally further comprises generating a second predetermined signal shape of a amplitude component of a radio frequency signal; generating the one or more predetermined conditions in the frequency component of the radio frequency signal at the first time interval; detecting the one or more predetermined conditions in the frequency component at a third time interval; determining the amplitude component at the third time interval; calculating a second time mismatch value based on the second predetermined signal shape of the radius amplitude component, the first time interval and the third time interval; and combining the time mismatch value and the second time mismatch value to determine the signal propagation time mismatch of the amplitude and frequency signal in a transmitter.

In example 9, the method of any of examples 1 to 7 optionally further comprises generating one or more predetermined conditions in a frequency component of the radio frequency signal at a fourth time interval relative to the predetermined signal shape; detecting the one or more predetermined conditions in the frequency component at a fifth time interval; determining the amplitude component at the fifth time interval; calculating a third time mismatch value based on the predetermined signal shape of the amplitude component, the fourth time interval and the fifth time interval; and combining the time mismatch value and the third time mismatch value to determine the signal propagation time mismatch of the amplitude and frequency signal in a transmitter.

Example 10 is a method for calibrating a signal propagation time mismatch between an amplitude signal path and a phase signal path of a modulator, comprising determining a first signal propagation time mismatch value for a first center frequency of the transmitter; determining a second signal propagation time mismatch value for a second center frequency of the transmitter; and calculating a third signal propagation time mismatch value for a third center frequency of the transmitter based on the first signal propagation time mismatch value, the second signal propagation time mismatch value, the first center frequency and the second center frequency.

Example 11 is a circuit for determining an amplitude and phase signal propagation time mismatch in a polar transmitter, comprising an analyzing circuit coupled to a phase signal processing path of the transmitter, the analyzing circuit being configured to detect one or more predetermined conditions in a frequency component of the radio frequency signal at a second time interval; and an evaluation circuit coupled to an amplitude signal processing path of the transmitter, the evaluation circuit being configured to determine an amplitude value at the second time interval and to calculate the time mismatch between the phase signal processing path and the amplitude signal processing path based on an expected amplitude value, the determined amplitude value and information on a predetermined signal shape of the amplitude component.

In example 12, in the circuit of example 11, the analyzing circuit is configured to determine a change of an instantaneous frequency of the frequency component.

In example 13, in the circuit of example 12, the analyzing circuit optionally further comprises a period determination circuit configured to determine a present time interval between a pair of two consecutive edges of the frequency component.

In example 14, the circuit of example 13 optionally further comprises a comparator configured to determine, if the present time interval deviates by more than a predetermined threshold from a previous time interval between at least one previous pair of two consecutive edges of the frequency component.

In example 15, the circuit of example 14 optionally further comprises a memory configured to store and to provide the previous time interval.

In example 16, in the circuit of any of examples 13 to 15, the period determination circuit comprises a first time to digital converter using every rising signal edge as a start and every falling signal edge as a stop; and a second time to digital converter using every falling signal edge as a start and every rising signal edge as a stop.

In example 1, in the circuit of any of examples 11 to 16, the analyzing circuit optionally further comprises a coarse delay circuit to apply a coarse delay to the frequency component prior to the period determination circuit.

Example 18 is a test signal generation circuit for a polar transmitter, comprising an amplitude signal generator configured to generate a predetermined signal shape of a amplitude component of a radio frequency signal; and a frequency signal generator configured to generate one or more predetermined conditions in a frequency component of the radio frequency signal at a predetermined first time interval relative to the predetermined signal shape.

In example 19, in the test signal generation circuit of example 18, the amplitude signal generator is configured to generate a linearly increasing amplitude component.

In example 20, in the test signal generation circuit of example 18 or 19, the frequency signal generator is configured to generate a significant change of the instantaneous frequency of the frequency component.

In example 21, in the test signal generation circuit of any of examples 18 to 20, the frequency signal generator optionally further comprises a phase signal generation circuit, the phase signal generation circuit being configured to generate a linearly increasing phase signal which is used to generate the frequency component.

Example 22 is a polar transmitter, comprising an amplitude signal processing path to generate an amplitude signal component; a phase signal processing path to generate a frequency signal component; and a circuit to determine an amplitude and phase signal propagation time mismatch according to any of examples 11 to 16 coupled to both the amplitude signal processing path and the phase signal processing path.

In example 23, in the polar transmitter of example 22, the circuit for determining the an amplitude and phase signal propagation time mismatch is coupled to both the amplitude signal processing path and the phase signal processing path directly upstream a radio frequency mixer configured to generate a radio frequency signal waveform from the amplitude signal component and the frequency signal component.

In example 24, the polar transmitter of example 22 or 23 optionally further comprises a test signal generation circuit according to any of examples 18 to 21 coupled to both the amplitude signal processing path and the phase signal processing path.

In example 25, in the polar transmitter of example 24, the test signal generation circuit is coupled to both the amplitude signal processing path and the phase signal processing path directly downstream a cordic circuit used to transfer an I/Q representation of the radio frequency signal to a polar representation.

Example 26 is a mobile telecommunication device comprising a polar transmitter according to any of examples 22 to 25.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A circuit for determining an amplitude and phase signal propagation time mismatch in a polar transmitter, comprising:
   an analyzing circuit coupled to a phase signal processing path of the polar transmitter, the analyzing circuit being configured to detect a significant condition in a frequency component of a radio frequency signal; and
   an evaluation circuit coupled to an amplitude signal processing path of the polar transmitter, the evaluation circuit being configured to determine an amplitude value of an amplitude component of the radio frequency signal and to calculate a time mismatch between the phase signal processing path and the amplitude signal processing path based on an expected amplitude value of the amplitude component, the determined amplitude value of the amplitude component and information on a predetermined signal shape of the amplitude component.

2. The circuit of claim 1, wherein the analyzing circuit is configured to determine a change of an instantaneous frequency of the frequency component.

3. The circuit of claim 2, wherein the analyzing circuit comprises:
   a period determination circuit configured to determine a present time interval between a pair of two consecutive edges of the frequency component.

4. The circuit of claim 3, further comprising:
   a comparator configured to determine, if the present time interval deviates by more than a predetermined threshold from a previous time interval between at least one previous pair of two consecutive edges of the frequency component.

5. The circuit of claim 4, further comprising:
   a memory configured to store and to provide the previous time interval.

6. The circuit of any of claim 3, wherein the period determination circuit comprises a first time to digital converter using every rising signal edge of the frequency component as a start and every falling signal edge of the frequency component as a stop; and
   a second time to digital converter using every falling signal edge of the frequency component as a start and every rising signal edge of the frequency component as a stop.

7. The circuit of claim 3, wherein the analyzing circuit further comprises a coarse delay circuit to apply a coarse delay to the frequency component prior to the period determination circuit.

8. A polar transmitter, comprising:
   an amplitude signal processing path to generate an amplitude signal component;
   a phase signal processing path to generate a frequency signal component; and
   a circuit to determine an amplitude and phase signal propagation time mismatch, the circuit comprising:
      an analyzing circuit coupled to the phase signal processing path of the polar transmitter, the analyzing circuit being configured to detect a significant condition in a frequency signal component of the a radio frequency signal; and
      an evaluation circuit coupled to the amplitude signal processing path of the polar transmitter, the evaluation circuit being configured to determine an amplitude value and to calculate the amplitude and phase signal propagation time mismatch between the phase signal processing path and the amplitude signal processing path based on an expected amplitude value of the amplitude signal component, the determined amplitude value of the amplitude signal component and information on a predetermined signal shape of the amplitude signal component.

9. The polar transmitter of claim 8, wherein the circuit for determining the amplitude and phase signal propagation time mismatch is coupled to both the amplitude signal processing path and the phase signal processing path at points before a radio frequency mixer configured to generate a radio frequency signal waveform from the amplitude signal component and the frequency signal component.

10. The polar transmitter of claim 8, further comprising:
    a test signal generation circuit coupled to both the amplitude signal processing path and the phase signal processing path, the test signal generation circuit comprising:
       an amplitude signal generator configured to generate a predetermined signal shape of an amplitude component of a radio frequency signal; and
       a frequency signal generator configured to generate a significant condition in a frequency component of the radio frequency signal at a predetermined first time interval relative to the predetermined signal shape.

11. The polar transmitter of claim 10, wherein the test signal generation circuit is coupled to both the amplitude signal processing path and the phase signal processing path at points after a cordic circuit used to transfer an I/Q representation of the radio frequency signal to a polar representation.

* * * * *

UNITED STATES PATENT AND TRADEMARK OFFICE
CERTIFICATE OF CORRECTION

PATENT NO. : 11,283,665 B2
APPLICATION NO. : 16/487107
DATED : March 22, 2022
INVENTOR(S) : Timo Gossmann and Dirk Friedrich It is certified that error appears in the above-identified patent and that said Letters Patent is hereby corrected as shown below:

On the Title Page

Column 1, The filing date of the priority application in the Foreign Application Priority Data (item (30)) shown as "Jan. 4, 2017" should read --April 1, 2017--.

Signed and Sealed this
Twentieth Day of September, 2022

Katherine Kelly Vidal
*Director of the United States Patent and Trademark Office*